(12) United States Patent
Yun et al.

(10) Patent No.: US 6,964,882 B2
(45) Date of Patent: Nov. 15, 2005

(54) FABRICATING COMPLEX MICRO-ELECTROMECHANICAL SYSTEMS USING A FLIP BONDING TECHNIQUE

(75) Inventors: Chang-Han Yun, Boston, MA (US); Lawrence E. Felton, Hopkinton, MA (US); Maurice S. Karpman, Brookline, MA (US); John A. Yasaitis, Lexington, MA (US); Michael W. Judy, Wakefield, MA (US); Colin Gormley, Belfast (GB)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/259,188

(22) Filed: Sep. 27, 2002

(65) Prior Publication Data

US 2004/0061192 A1    Apr. 1, 2004

(51) Int. Cl.⁷ ............................................. H01L 23/12
(52) U.S. Cl. ..................................... 438/108; 438/455
(58) Field of Search .............................. 438/22, 25–28, 438/48, 51, 55, 64–67, 106–109, 421, 422, 438/455–459

(56) References Cited

U.S. PATENT DOCUMENTS

| | | | |
|---|---|---|---|
| 4,786,357 A | 11/1988 | Campanelli et al. ........ 156/633 |
| 5,173,392 A | 12/1992 | Miersch et al. ............. 430/311 |
| 5,323,051 A | 6/1994 | Adams et al. ............... 257/417 |
| 5,535,526 A | 7/1996 | White ............................ 34/78 |
| 5,594,979 A | 1/1997 | Borchelt et al. ........... 29/25.35 |
| 5,604,160 A | 2/1997 | Warfield ...................... 437/209 |
| 5,668,033 A | 9/1997 | Ohara et al. ................ 438/113 |
| 5,761,350 A | 6/1998 | Koh ............................ 385/14 |
| 5,798,557 A | 8/1998 | Salatino et al. ............. 257/416 |
| 5,824,177 A | 10/1998 | Yoshihara et al. .......... 156/250 |
| 5,915,168 A | 6/1999 | Salatino et al. ............. 438/110 |
| 6,297,072 B1 | 10/2001 | Tilmans et al. ............. 438/106 |
| 6,303,986 B1 | 10/2001 | Shook ......................... 257/680 |
| 6,327,401 B1 | 12/2001 | Mitsuda et al. ............... 385/49 |
| 6,373,620 B1 | 4/2002 | Wang .......................... 359/315 |
| 6,400,009 B1 * | 6/2002 | Bishop et al. .............. 257/704 |
| 6,516,671 B2 | 2/2003 | Romo et al. .................. 73/718 |
| 6,543,286 B2 | 4/2003 | Garverick et al. ........ 73/514.18 |
| 6,555,417 B2 | 4/2003 | Spooner et al. ............. 438/113 |
| 6,587,626 B2 | 7/2003 | Beguin et al. ............... 385/125 |
| 6,620,642 B2 | 9/2003 | Dudoff et al. ................ 438/26 |
| 6,621,137 B1 | 9/2003 | Ma et al. ..................... 257/528 |
| 6,706,546 B2 | 3/2004 | Yoshimura et al. ........... 438/31 |
| 2002/0021055 A1 | 2/2002 | Lee et al. .................... 310/309 |
| 2002/0027294 A1 | 3/2002 | Neuhaus et al. ............. 257/778 |

(Continued)

FOREIGN PATENT DOCUMENTS

EP    1 096 564 A1    5/2001    ........... H01L 23/04

(Continued)

OTHER PUBLICATIONS

Smith et al., Micromachined Packaging for Chemical Microsensors, IEEE Trans, Electron Devices, Jun. 1988, vol. 35, No. 6, pp. 192-197.

(Continued)

*Primary Examiner*—Howard Weiss
*Assistant Examiner*—Marcos D. Pizarro-Crespo
(74) *Attorney, Agent, or Firm*—Bromberg & Sunstein LLP

(57) ABSTRACT

A flip-bonding technique is used to fabricate complex microelectromechanical systems. Various micromachined structures are fabricated on the front side of each of two wafers. One of the wafers is flipped over and bonded to the other wafer so that the front sides of the two wafers are bonded together in a flip-stacked configuration.

9 Claims, 6 Drawing Sheets

600

U.S. PATENT DOCUMENTS

| | | | |
|---|---|---|---|
| 2002/0045030 A1 | 4/2002 | Ozin et al. | 428/173 |
| 2002/0054422 A1 | 5/2002 | Carr et al. | 359/291 |
| 2002/0074637 A1 | 6/2002 | McFarland | 257/686 |
| 2002/0088988 A1 | 7/2002 | Silverbrook | 257/99 |
| 2002/0090180 A1 | 7/2002 | Silverbrook | 385/92 |
| 2002/0109894 A1 | 8/2002 | Clark et al. | 359/224 |
| 2002/0115263 A1 | 8/2002 | Worth et al. | 438/455 |
| 2002/0197761 A1 | 12/2002 | Patel et al. | 438/52 |
| 2003/0053233 A1 | 3/2003 | Felton | 359/883 |
| 2003/0077881 A1 | 4/2003 | Gelmi et al. | 438/464 |
| 2003/0092229 A1 | 5/2003 | Silverbrook | 438/200 |
| 2003/0113067 A1 | 6/2003 | Koh et al. | 385/48 |
| 2003/0119278 A1 | 6/2003 | McKinnell | 438/455 |
| 2003/0174383 A1 * | 9/2003 | Bolle et al. | 359/295 |

FOREIGN PATENT DOCUMENTS

| | | | | |
|---|---|---|---|---|
| JP | 2001144117 A | 5/2001 | | H01L 21/56 |
| JP | 2001269900 A | 10/2001 | | B81C 1/00 |

OTHER PUBLICATIONS

Peterson et al., Silicon Fusion Bonding for Pressure Sensors, Rec. of the IEEE Solid-State Sensor and Actuator Workshop, 1988, pp. 209-212.

Rudolf et al., Silicon Microaccelerometer, Transducers' 87, Rec. of the $4^{th}$ Int. Conf. on Solid-State Sensors and Actuators, 1987, pp. 376-379.

Ko et al., Bonding Techniques for Microsensors, Micromachining and Micropackaging of Tansducers, 1985, pp. 198-208.

Roylance et al., A Batch-Fabricated Silicon Accelerometer, IEEE Trans. Electron Devices, Dec. 1979, vol. ED-26, No. 12, pp. 352-358.

Yoshio Awatani et al., Damage Free Dicing Method for MEMS Devices, International Conference on Opical MEMs Conference Digest, pp. 137-138, Aug. 20-23, 2002.

Lee et al., Fabrication of Silicon Optical Scanner for Laser Display; 2000, pp. 13-14.

* cited by examiner

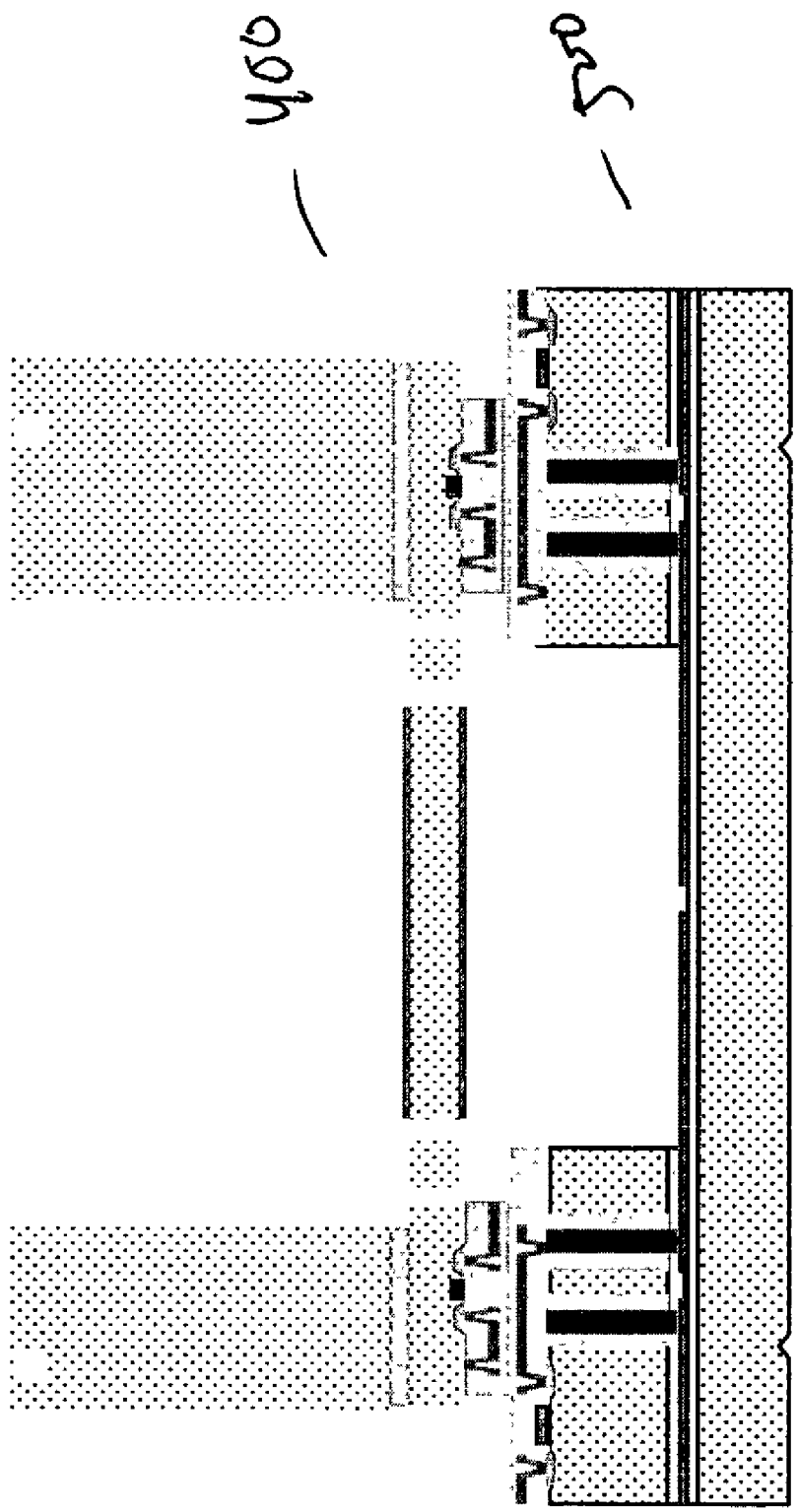
FIG. 6 <u>600</u>

FABRICATING COMPLEX MICRO-ELECTROMECHANICAL SYSTEMS USING A FLIP BONDING TECHNIQUE

FIELD OF THE INVENTION

The present invention relates generally to micro-electromechanical systems (MEMS), and more particularly to fabricating complex micro-electromechanical systems using a flip bonding technique.

BACKGROUND OF THE INVENTION

A micro-electromechanical system (MEMS) is a micromachined device that includes mechanical structures that are controlled electronically. MEMS devices can be such things as optical switching devices, accelerometers, and gyroscopes. In order to increase functionality of MEMS devices, it is desirable to integrate MEMS devices with integrated circuits (ICs) in a single chip. Such a chip is often referred to as an integrated MEMS.

Integrated MEMS devices are typically fabricated in a planar fashion on one side of a wafer substrate. Mechanical and electronic structures can be formed on the wafer in any of a variety of ways, including etching into the wafer and depositing materials onto the wafer. Because the mechanical and electronic structures are formed in a single plane with structures adjacent to one another, the integrated MEMS device can encompass a relatively large chip area. Also, because the mechanical and electronic structures are formed on a single wafer, the various processes used to form the mechanical and electronic structures must be compatible with one another (i.e., a particular process should not cause damage to structures formed by earlier processes).

SUMMARY OF THE INVENTION

In accordance with one aspect of the invention, a flip-bonding technique is used to fabricate complex micro-electromechanical systems. Various micromachined structures are fabricated on the front side of each of two wafers. One of the wafers is flipped over and bonded to the other wafer so that the front sides of the two wafers are bonded together in a flip-stacked configuration.

In accordance with another aspect of the invention, a method for fabricating a micro-electromechanical system involves providing a first micromachined apparatus having a front side including at least one micromachined structure, providing a second micromachined apparatus having a front side including at least one micromachined structure, and bonding the front side of the first micromachined apparatus and the front side of the second micromachined apparatus together. The first micromachined apparatus and the second micromachined apparatus are typically fabricated so that the micromachined structures on the first micromachined apparatus align with the micromachined structures on the second micromachined apparatus when the front side of the first micromachined apparatus and the front side of the second micromachined apparatus are bonded together, and bonding the front side of the first micromachined apparatus and the front side of the second micromachined apparatus together typically involves aligning the front side of the first micromachined apparatus and the front side of the second micromachined apparatus. Bonding the front side of the first micromachined apparatus and the front side of the second micromachined apparatus together may involve solder bump and gold compression between bond pads on the front side of the first micromachined apparatus and the front side of the second micromachined apparatus. In various embodiments of the invention, the first micromachined apparatus comprises a micro-electromechanical system wafer, and the second micromachined apparatus comprises an integrated circuit wafer. Providing the first micromachined structure typically involves fabricating offset structures on the front side of the micro-electromechanical system wafer. Providing the second micromachined structure typically involves fabricating offset structures on the front side of the integrated circuit wafer. The micro-electromechanical system wafer may include micromachined optical mirrors, and the integrated circuit wafer may include drive and sense electrodes for the micromachined optical mirrors.

In accordance with another aspect of the invention, an apparatus includes a first micromachined wafer having micromachined structures on a front side and a second micromachined wafer having micromachined structures on a back side, wherein the front side of the first micromachined wafer and the front side of the second micromachined wafer are bonded together. The first micromachined wafer and the second micromachined wafer are typically fabricated so that the micromachined structures on the first micromachined wafer align with the micromachined structures on the second micromachined wafer when the front side of the first micromachined wafer and the front side of the second micromachined wafer are bonded together. The front side of the first micromachined wafer and the front side of the second micromachined wafer may be bonded together using solder bump and gold compression between bond pads on the front side of the first micromachined wafer and the front side of the second micromachined wafer. The first micromachined wafer may be a micro-electromechanical system wafer, and the second micromachined wafer may be an integrated circuit wafer. The micro-electromechanical system wafer may include micromachined optical mirrors, and the integrated circuit wafer may include drive electrodes for the micromachined optical mirrors. The micro-electromechanical system wafer may include offset structures fabricated on the front side, and the drive electrodes may be formed on the front side of the integrated circuit wafer. The integrated circuit wafer may include offset structures fabricated on the front side, and the drive electrodes may be formed on the front side of the integrated circuit wafer within a depression formed by the offset structures.

One advantage of bonding the two wafers together in a flip-stacked configuration is that the density of devices is increased for a given chip area. Another advantage of bonding the two wafers together in a flip-stacked configuration is that it facilitates the fabrication of complex three-dimensional structures.

An advantage of fabricating the two wafers separately and subsequently bonding them together in a flip-stacked configuration is that fabrication and handling processes can be optimized for each wafer.

BRIEF DESCRIPTION OF THE DRAWINGS

In the accompanying drawings:

FIG. 6 shows the MEMS wafer and the IC wafer with offset structures bonded together in a flip-stack configuration using the flip-bonding technique of the present invention.

DETAILED DESCRIPTION OF A PREFERRED EMBODIMENT

Figure 1:
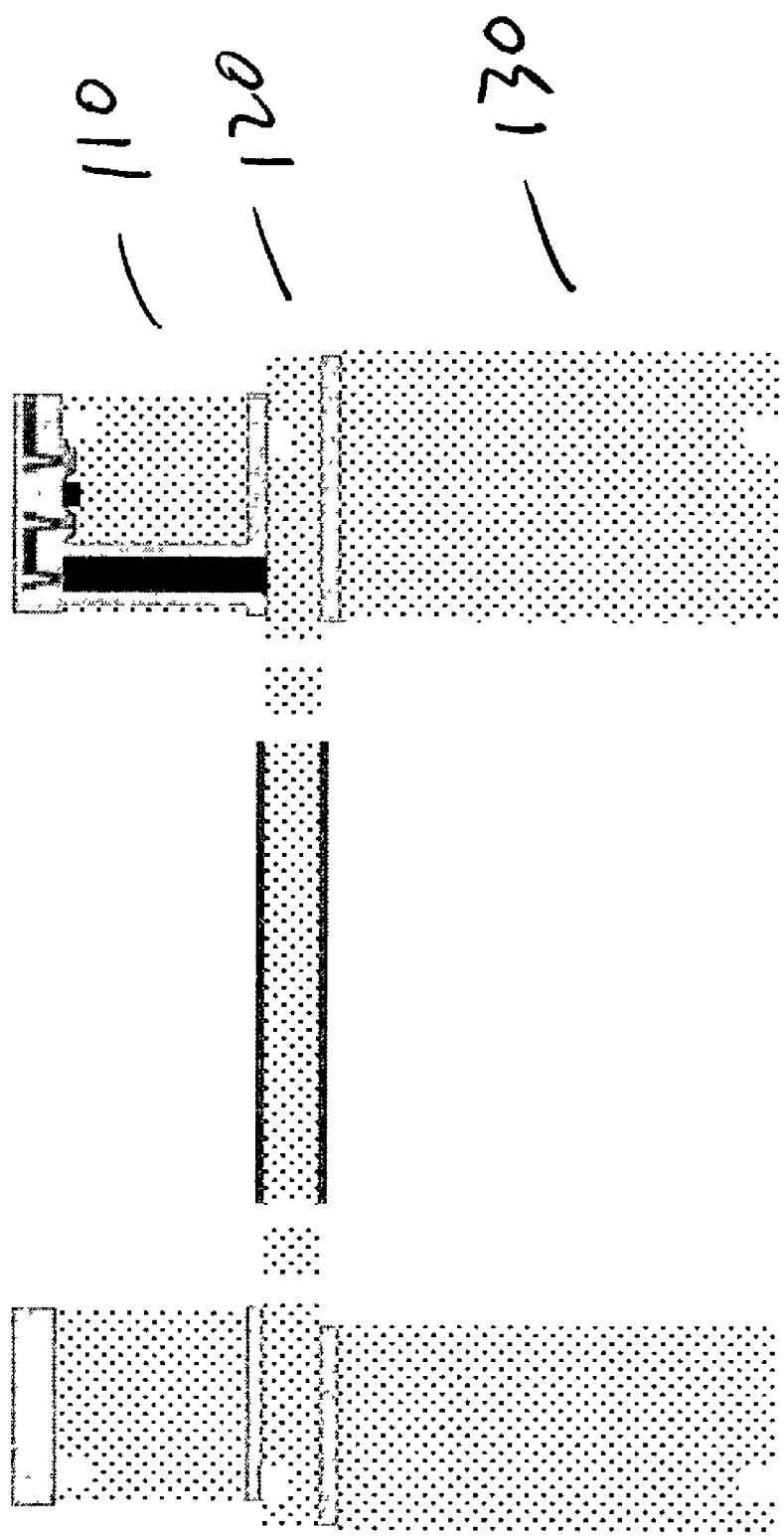
FIG. 1 shows an exemplary MEMS wafer having offset structures in accordance with an embodiment of the present invention.

In an embodiment of the present invention, various micromachined structures are fabricated on the front side of each of two wafers. One of the wafers is flipped over and bonded to the other wafer so that the front sides of the two wafers are bonded together in a flip-stacked configuration. For convenience, this technique for bonding the front sides of the two wafers together is referred to hereinafter as "flip bonding." Among other things, bonding the two wafers together in a flip-stacked configuration increases the density of devices for a given chip area and facilitates the fabrication of complex three-dimensional structures.

Specifically, micromachined structures are formed on a front side of each of the wafers. The various micromachined structures may include such things as mechanical structures, high and low voltage electronics, and electrical interconnects. The various micromachined structures may be fabricated using any of a variety of techniques, including various etching and material depositing techniques. The wafers may be any type of wafer, including a silicon, polysilicon, silicon-on-insulator (SOI), or multiple stack SOI wafer.

After the two wafers have been fabricated, the wafers are aligned face-to-face. Then, some appropriate interconnect processing is performed, and the two wafers are bonded face-to-face. The wafers can be bonded together using any of a variety of bonding techniques, and the present invention is in no way limited to any particular bonding technique. The result is a flip-stacked structure with two adjacent layers of micromachined structures. After bonding the two wafers together, additional micromachining and processing may be completed on the back side of either or both of the wafers.

It should be noted that the two wafers may be fabricated from different types of wafers and/or different fabrication techniques for forming the various micromachined structures. This allows each wafer to be handled and processed separately using processes that are optimized for the particular wafer and types of structures to be formed on the wafer.

In an exemplary embodiment of the present invention, an integrated MEMS device is formed using the flip-bonding technique. Specifically, a MEMS wafer is bonded face-to-face with an integrated circuit (IC) wafer using the flip-bonding technique.

The MEMS wafer typically includes various mechanical structures, low-voltage electronics, and electrical interconnects. For example, an optical MEMS wafer might include optical mirrors that are formed using an etching technique and deposited with various materials (e.g., a diffusion barrier layer, a reflective gold layer, and an anti-static material layer), as well as various electronics and electrical interconnects. These structures may be fabricated on the MEMS wafer using any of a variety of techniques, including various etching and material depositing techniques. The MEMS wafer may be any type of wafer, including a silicon, polysilicon, silicon-on-insulator (SOI), or multiple stack SOI wafer.

The IC wafer typically includes various high-voltage and other complex electronics, such as high-voltage MEMS driving electrodes, signal processors, and amplifiers. These electronics may be fabricated on the IC wafer using any of a variety of techniques, including various etching and material depositing techniques. The electronics on the IC wafer are typically configured so as to align with various micromachined features that are fabricated on the front side of the MEMS wafer when bonded face-to-face with the MEMS wafer as described above. The IC wafer may be any type of wafer, including a silicon, polysilicon, silicon-on-insulator (SOI), or multiple stack SOI wafer.

After the MEMS and IC wafers have been fabricated, the MEMS and IC wafers are aligned face-to-face. Then, some appropriate interconnect processing is performed, and the MEMS and IC wafers are bonded face-to-face, for example, using a solder bump and gold compression between bond pads on the two wafers. The result is a flip-stacked structure with two adjacent layers of micromachined structures. After bonding the MEMS and IC wafers together, additional micromachining and processing may be completed on the back side of either or both of the wafers.

It should be noted that the MEMS and IC wafers may be fabricated from different types of wafers and/or different fabrication techniques for forming the various micromachined structures. This allows each wafer to be handled and processed separately using processes that are optimized for the particular wafer and types of structures to be formed on the wafer.

Optical MEMS devices include micromachined optical mirrors that are typically controlled electrostatically via high-voltage MEMS drive electrodes. One issue with optical MEMS devices is the distance between high-voltage MEMS drive electrodes and the micromachined mirrors they control. This distance must be very precise. Variations in the distance between the optical mirrors and the drive electrodes can result in a variety of mirror control problems.

Therefore, offset structures formed on the front side of either the MEMS wafer or the IC wafer are used to separate the optical mirrors and the drive electrodes when the MEMS wafer and IC wafer are bonded face-to-face using the flip-bonding technique. The offset structures can be formed in a variety of ways, including various micromachining and depositing techniques, and, depending on the required distance and tolerance, can even be formed using thick solder bumps or shimmed epoxy. One advantage of forming the offset structures on the front side of a wafer and flip-bonding the wafers compared to, for example, trying to control the distance between the optical mirrors and the drive electrodes through back side processing of the MEMS wafer (e.g., thinning of the back side of the MEMS wafer) and bonding the front side of the IC wafer to the back side of the MEMS wafer is that, generally speaking, it is easier to control the thickness of materials deposited on the front side of the wafer than to control the thickness of the wafer through back side processing.

In one exemplary embodiment of the present invention, the offset structures are formed on the front side of the MEMS wafer such that the optical mirrors are set a predetermined distance from the surface to which the IC wafer is bonded. The drive electrodes are formed substantially on the surface of the IC wafer. When the MEMS wafer and the IC wafer are bonded face-to-face using the flip-bonding technique, the offset structures maintain a predetermined distance between the optical mirrors and the drive electrodes.

FIG. 1 shows an exemplary MEMS wafer 100 in accordance with an embodiment of the present invention. Among other things, the MEMS wafer 100 includes substrate 130, an optical mirror layer 120, and offset structures 110. Various electronics and interconnects for interfacing with the IC wafer are formed on the tops of the offset structures 110. The MEMS wafer 100 is typically fabricated from a double stack SOI wafer.

Figure 2:
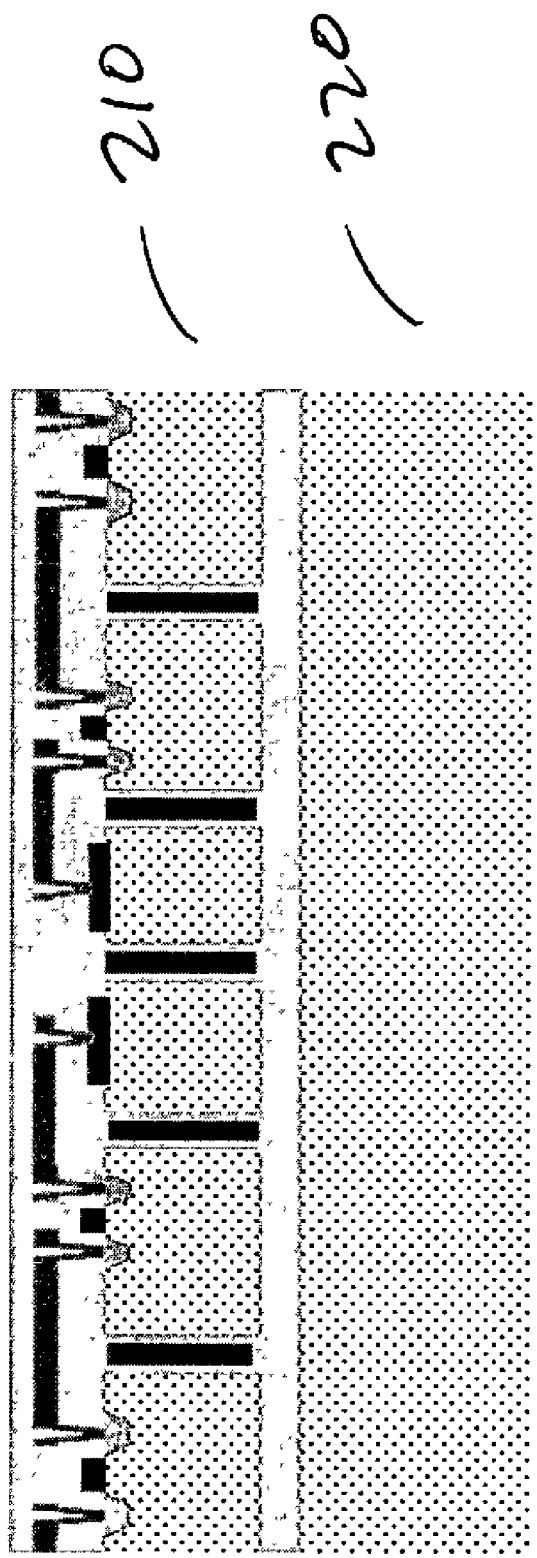
FIG. 2 shows an exemplary IC wafer excluding offset structures in accordance with an embodiment of the present invention.

FIG. 2 shows an exemplary IC wafer 200 in accordance with an embodiment of the present invention. Among other things, the IC wafer 200 includes a substrate 220 and a device layer 210. The device layer 210 includes the drive electrodes and other integrated circuits, as well as various interconnects for interfacing with the MEMS wafer.

Figure 3:
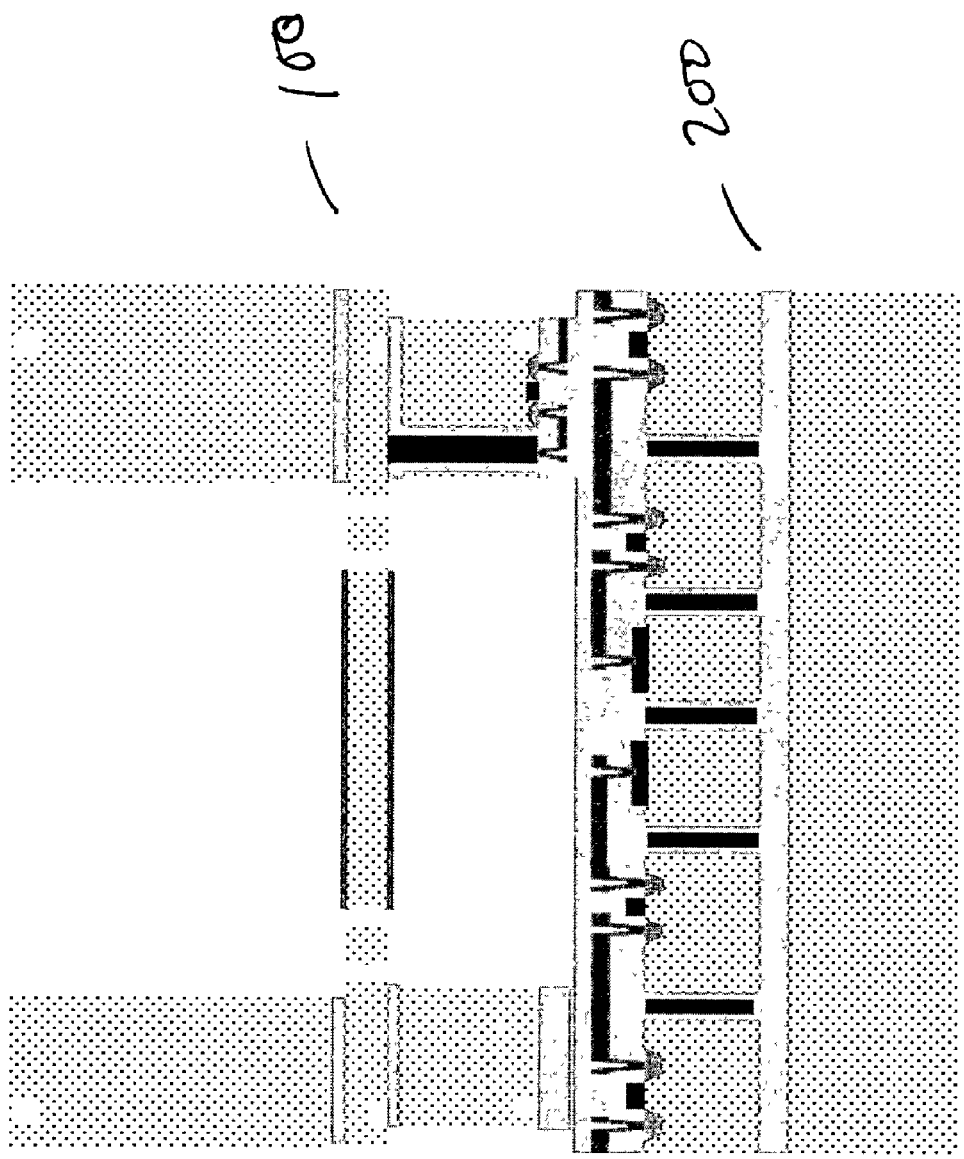
FIG. 3 shows the MEMS wafer with offset structures and the IC wafer bonded together in a flip-stack configuration using the flip-bonding technique of the present invention.

FIG. 3 shows the MEMS wafer 100 and the IC wafer 200 bonded together in a flip-stack configuration 300 using the flip-bonding technique.

In another exemplary embodiment of the present invention, the offset structures are formed on the front side of the IC wafer such that the drive electrodes are set a predetermined distance from the surface to which the MEMS wafer is bonded. The optical mirrors are formed substantially on the surface of the MEMS wafer. When the MEMS wafer and the IC wafer are bonded face-to-face using the flip-bonding technique, the offset structures maintain a predetermined distance between the optical mirrors and the drive electrodes.

Figure 4:
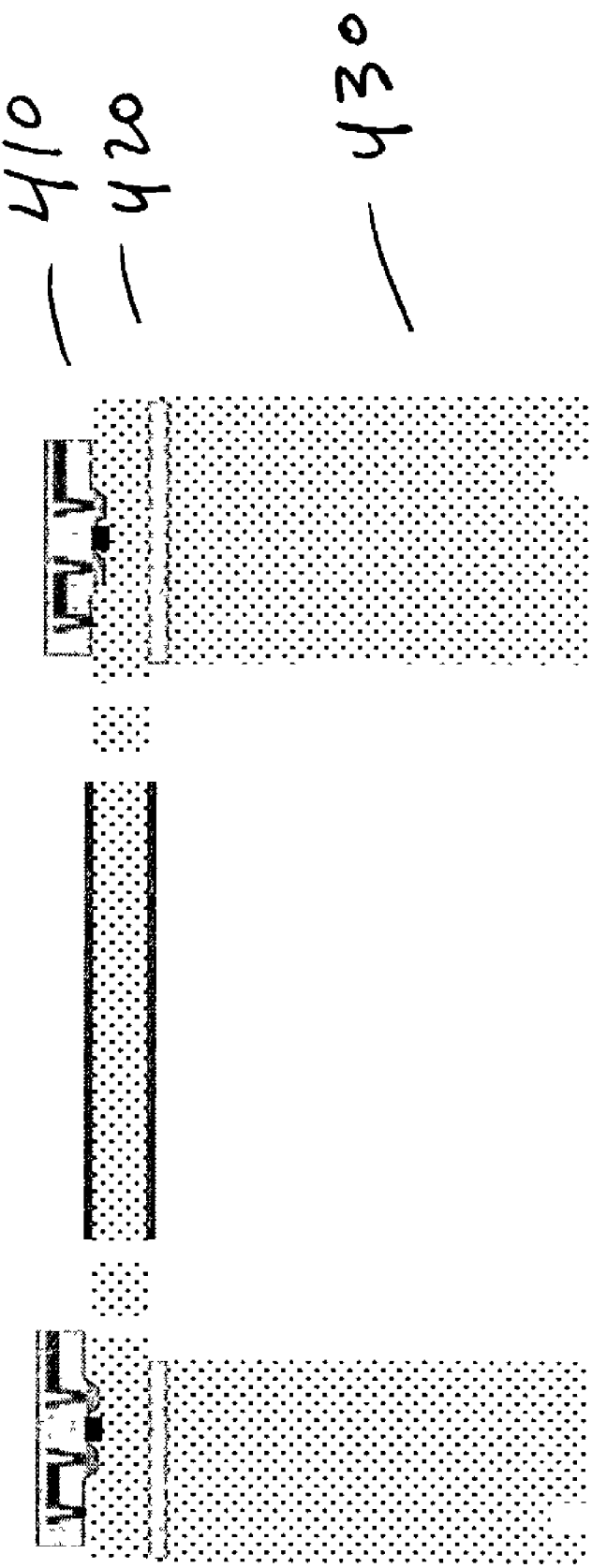
FIG. 4 shows an exemplary MEMS wafer excluding offset structures in accordance with an embodiment of the present invention.

FIG. 4 shows an exemplary MEMS wafer 400 in accordance with an embodiment of the present invention. Among other things, the MEMS wafer 400 includes substrate 430, an optical mirror layer 420, and an electronic/interconnect layer 410. The MEMS wafer 400 is typically fabricated from a single stack SOI wafer.

Figure 5:
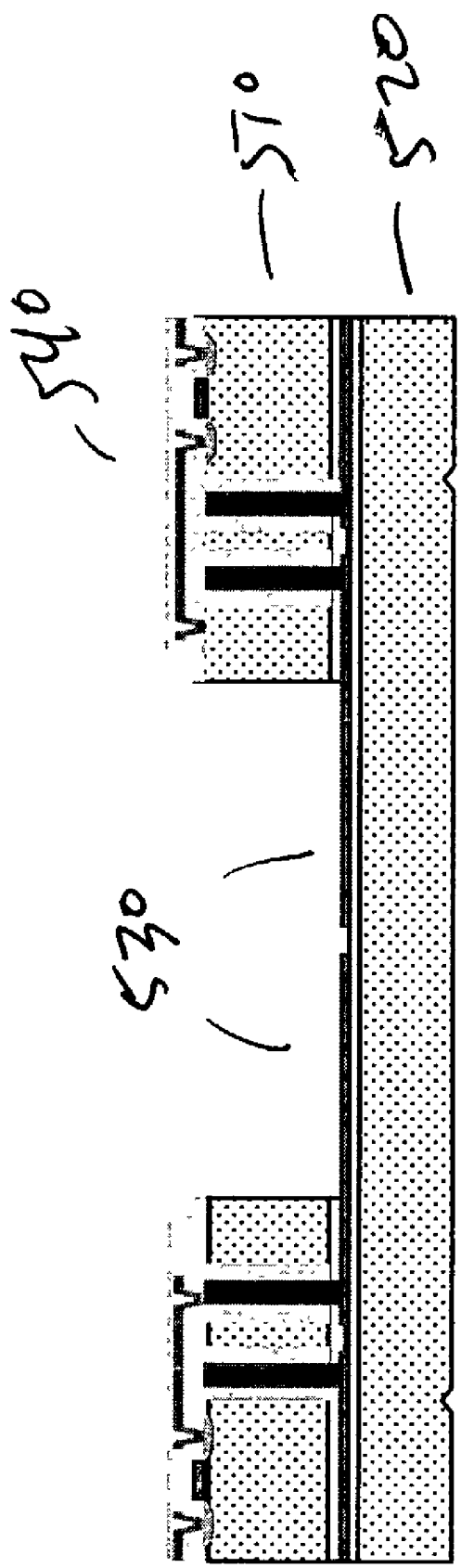
FIG. 5 shows an exemplary IC wafer with offset structures in accordance with an embodiment of the present invention.

FIG. 5 shows an exemplary IC wafer 500 in accordance with an embodiment of the present invention. Among other things, the IC wafer 500 includes a substrate 520 and offset structures 510. Drive electrodes 530 are formed in the recess formed by the offset structures 510. Various electronics 540, such as integrated circuits and interconnects for interfacing with the MEMS wafer, are formed on the tops of the offset structures 510. Electrical connections to the drive electrodes 530 are formed through the offset structures 510. The IC wafer 500 is typically fabricated from a SOI wafer.

FIG. 6 shows the MEMS wafer 400 and the IC wafer 500 bonded together in a flip-stack configuration 600 using the flip-bonding technique.

The following commonly-owned U.S. patent applications may be pertinent to the subject matter described herein, and are hereby incorporated herein by reference in their entireties:

U.S. patent application Ser. No. 10/259,174 entitled FABRICATING COMPLEX MICRO-ELECTROMECHANICAL SYSTEMS USING A DUMMY HANDLING SUBSTRATE, filed on even date herewith in the names of Chang-Han Yun, Lawrence E. Felton, Maurice S. Karpman, John A. Yasaitis, Michael W. Judy, and Cohn Gormley; and U.S. patent application Ser. No. 10/259,173 entitled FABRICATING INTEGRATED MICRO-ELECTROMECHANICAL SYSTEMS USING AN INTERMEDIATE ELECTRODE LAYER, filed on even date herewith in the names of Chang-Han Yun, Lawrence E. Felton, Maurice S. Karpman, John A. Yasaitis, Michael W. Judy, and Cohn Gormiley.

What is claimed is:

1. A method for fabricating a micro-electromechanical system, the method comprising:
providing a first micromachined apparatus having a front side including at least one micromachined structure and raised offset structures built upon the front side;
providing a second micromachined apparatus having a front side including at least one micromachined structure; and
bonding the front side of the first micromachined apparatus and the front side of the second micromachined apparatus together, wherein one micromachined apparatus comprises a micro-electromechanical system wafer having micromachined mechanical and electrical components and the other micromachined apparatus comprises an integrated circuit wafer having micromachined integrated circuitry, and wherein the raised offset structures separate the micromachined structures of the first and second apparatuses by a predetermined distance, and wherein bonding the front side of the first micromachined apparatus and the front side of the second micromachined apparatus together comprises solder bump and gold compression between bond pads on the raised offset structures and the front side of the second micromachined apparatus.

2. The method of claim 1, wherein the first micromachined apparatus and the second micromachined apparatus are fabricated so that the micromachined structures on the first micromachined apparatus align with the micromachined structures on the second micromachined apparatus when the front side of the first micromachined apparatus and the front side of the second micromachined apparatus are bonded together.

3. The method of claim 1, wherein bonding the front side of the first micromachined apparatus and the front side of the second micromachined apparatus together comprises:
aligning the front side of the first micromachined apparatus and the front side of the second micromachined apparatus.

4. The method of claim 1, wherein the micro-electromechanical system wafer comprises micromachined optical mirrors, and wherein the integrated circuit wafer comprises drive electrodes for the micromachined optical mirrors.

5. The method of claim 1, wherein providing the first micromachined apparatus comprises:
fabricating the raised offset structures by deposition.

6. The method of claim 1, wherein at least one of the wafers includes a drive electrode for driving a micromachined structure.

7. The method of claim 6, wherein the drive electrode electrostatically drives the micromachined structure.

8. The method of claim 1, wherein at least one of the wafers includes a sense electrode for sensing a micromachined structure.

9. The method of claim 8, wherein the sense electrode electrostatically senses the micromachined structure.

* * * * *